United States Patent [19]

Sherwood et al.

[11] Patent Number: 4,613,955
[45] Date of Patent: Sep. 23, 1986

[54] BIAS MAGNET TEMPERATURE TRACKING OF MAGNETIC BUBBLE MEMORIES

[75] Inventors: Richard C. Sherwood; William J. Tabor, both of New Providence; Eva M. Vogel, Berkeley Heights; Robert Zappulla, Lebanon, all of N.J.

[73] Assignee: AT&T Bell Laboratories, Murray Hill, N.J.

[21] Appl. No.: 535,249

[22] Filed: Sep. 23, 1983

[51] Int. Cl.[4] ............................................. G11C 19/08
[52] U.S. Cl. ...................................... 365/27; 365/32; 428/692
[58] Field of Search .................... 365/2, 27, 28, 32; 335/217, 227, 296, 302; 336/110, 234; 427/126.6, 127; 428/692, 693

[56] References Cited

U.S. PATENT DOCUMENTS 3,968,481  7/1976  Grundy et al. ................. 365/27
4,150,440  4/1979  Bonnie et al. ................... 365/2

Primary Examiner—James W. Moffitt
Attorney, Agent, or Firm—Herbert M. Shapiro; Peter V. D. Wilde

[57] ABSTRACT

Wide temperature range magnetic bubble memories are realized by using new compositions of rare earth garnets which require nonlinear bias field for operation over a given temperature range. The bias field structure for providing the corresponding nonlinear bias field includes plates of barium ferrite plus additional plates of Ni-Cu alloys and/or polycrystalline dysprosium (or other rare earths, singly or in combination) iron garnet to provide a nonlinear bias field versus temperature characteristic to match that of the bubble layer.

4 Claims, 7 Drawing Figures

BIAS MAGNET TEMPERATURE TRACKING OF MAGNETIC BUBBLE MEMORIES

FIELD OF THE INVENTION

This invention relates to magnetic bubble memories and, more particularly, to bias magnet arrangements for such memories.

BACKGROUND OF THE INVENTION

Magnetic bubble memories comprise a layer of magnetic material in which magnetic bubbles can be moved. A magnetic bubble is a cylindrical region (or domain) of a layer of a magnetic material with a magnetization direction antiparallel to the magnetization in the remainder of the layer. The layer is chosen to comprise materials and to be of a geometry so that the magnetization of the layer aligns with an axis perpendicular to the plane of the layer. A cylindrical domain, accordingly, has a circular cross section in the plane of the layer and appears as a bubble when viewed through a microscope under polarized light.

The diameter of the circular cross section is a function of a bias field of a polarity to reduce that diameter. The bias field is supplied by external magnets which form part of the package encapsulating the bubble memory. The value of the bias field is set between characteristic high and low limits to form stable bubbles as is well understood in the art.

The bias field required for optimum device characteristics changes with changes in ambient temperature. Consequently, bubble memories are characterized by a temperature range of operation beyond which operation errors are encountered. A problem exists as to how to extend the operating temperature range.

Initially, bubble memories were made only from a limited class of materials which allowed operation over a specified narrow temperature range at a given bias value. U.S. Pat. No. 3,711,841 of J. E. Geusic and L. G. Van Uitert issued Jan. 16, 1973 discloses the use of bubble memories and biasing magnets of materials which were chosen to compensate for changes in magnetic properties of the bubble layer as temperature changed. That invention allowed previously unacceptable materials to be used for bubble memories and allowed operation with a bias field generating arrangement which changed the bias field as a function of temperature.

Although that invention has permitted bubble memories to become commercially practical, bubble memory operation over increasingly larger temperature ranges is desirable. Specifically, bubble memories operable over a temperature range of from about −50 degrees C. to about 140 degrees C. are highly desirable, particularly for military and space applications. Such a temperature range has not been realized with any commercially available bubble memories, and no suggestion of how such a range could be achieved has appeared in the literature.

BRIEF DESCRIPTION OF THE INVENTION

The foregoing problem is partially resolved by employing new wide temperature range compositions of rare earth, iron garnets for the bubble layer. In one instance, a bubble layer uses a particularly advantageous bismuth, gadolinium, holmium doped garnet $(YBiGdHoCa)_3(FeGeSi)_5O_{12}$ to provide wide temperature range characteristics. Copending application Ser. No. 319,609, of R. C. LeCraw, L. C. Luther, and T. J. Nelson, filed Nov. 9, 1981 and now U.S. Pat. No. 4,419,417 suitable materials. However, such materials require bias fields that change nonlinearly with temperature which have not been readily available over the required temperature range.

The present invention is directed at a bias magnet structure which provides a bias field which can match the resulting nonlinear characteristics of such a bubble layer over the required temperature range. The inventive bias magnet structure includes a number of plates with materials which are coordinated with specific compositions and properties of the bubble layer material. In particular, in order to provide a suitable bias field that changes nonlinearly with temperature, polycrystalline rare earth garnet layers along with layers of nickel-copper (Ni-Cu) alloys of different compositions are placed in series, magnetically, with the familiar barium ferrite permanent magnets. The presence of a single layer of Ni-Cu alloy increases the slope of the temperature coefficient of the bias field over a limited range of temperatures. Moreover, each of the garnets in the bias field structure is characterized by an increasing magnetic moment with temperature above its compensation temperature. The combination of increasing garnet and decreasing barium ferrite magnetic moments with increasing temperature creates a wide variety of temperature profiles depending on the amount and chemical formulation of the garnet used. The compensation point as well as the magnitude of the magnetic moment can also be controlled by changing the garnet formulation to provide a bias magnet structure which provides a bias field to match a nonlinear curve.

Generally, the use of a nonlinear material in a magnetic bias magnet for a magnetic bubble memory, a magnetic bubble memory with a bias magnet structure which provides a bias field which varies nonlinearly with temperature, and the resulting bias field structure itself are felt to be significant departures from prior art thinking.

DETAILED DESCRIPTION

Figure 1:
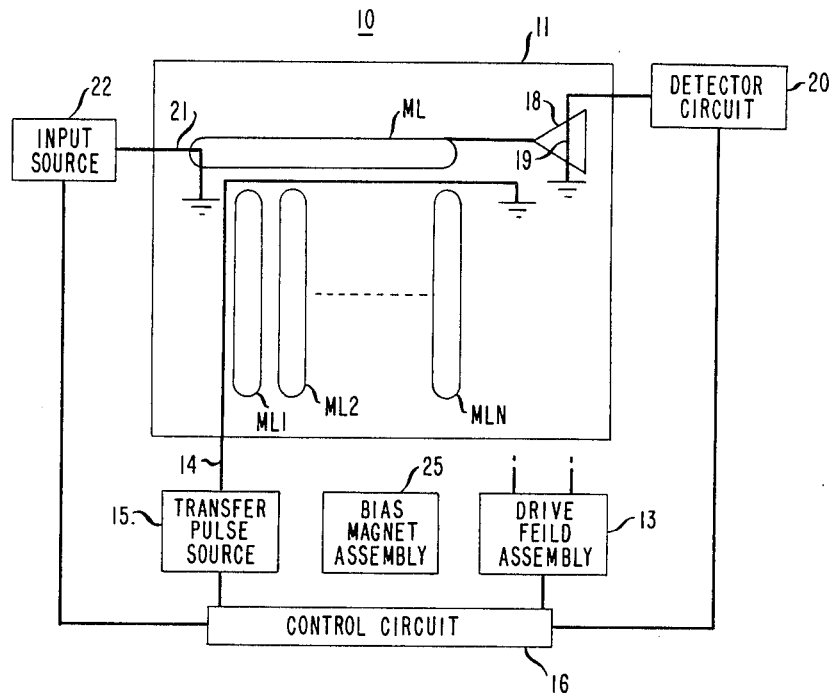
FIG. 1 is a schematic block diagram of a prior art magnetic bubble memory.

FIG. 1 shows a magnetic bubble memory 10 of a type described in U.S. Pat. No. 3,810,132 of A. H. Bobeck issued May 7, 1974. Such a memory is of the "field access" type which employs a magnetic drive field to move bubbles along paths defined by magnetically soft elements.

The magnetic elements are formed on the surface of the layer 11 in which magnetic bubbles move. The drive field is designed to reorient (typically rotate) in the plane of the layer of bubble material causing changing pole patterns in the magnetically soft elements. These changing pole patterns cause patterns of magnetic bubbles to move along paths defined by the magnetically soft elements.

The paths along which magnetic bubbles are moved are represented by closed "minor loop" lines ML1, ML2, ..., MLN and a "major loop" ML. Bubbles move about the paths represented by lines ML1, ..., MLN in a manner to move consecutive bits in parallel to a position where those paths come into close proximity to path ML. Thus, bits ML11, ML21, ..., MLN1, the first bits in all the paths, are followed by bits ML12, ML22, ..., MLN2, the second bits in those paths. Each time the rotating field rotates through one cycle, a new set of bits occupies the positions of close proximity. If each minor loop contains 512 bits, 512 cycles of the rotating field circulate the entire set of bits through those positions of close proximity. The rotating field is supplied by well-known means and is represented in FIG. 1 by block 13.

During each cycle of the rotating drive field a set of correspondingly numbered bits (1-N) occupies the positions of close proximity. These bits represent a binary word and are positioned for replication (or transfer) to the major loop for a read operation. A transfer conductor 14 couples the positions of close proximity for causing the requisite replication when pulsed. A source for pulsing conductor 14 is represented as block 15. Source 15 is connected to a control circuit 16 for synchronizing the transfer pulses to the rotating field.

A binary word (copy) replicated into the major loop moves toward expander-detector arrangement 18 as the original word continues to circulate in the minor loops. The copy generates N consecutive signals in magnetoresistive detector 19 which are applied to a suitable detector circuit represented by block 20. The copy is then discarded in a well understood manner.

A write operation is similar to the above-described read operation except that an original word is eliminated when it occupies the position of close proximity. Transfer pulse source 15 is controlled to pulse conductor 14 at a different point in the rotating field cycle to accomplish such a word-destruct operation in a well understood manner. A blank word location now circulates in the minor loop as the rotating field circulates.

A new word is introduced to the major loop in positions spaced from the positions of close proximity so that the new word arrives at those positions coincidently with the arrival of the blank word location. During the cycle of coincident arrival, transfer pulse source 15 pulses conductor 14 in a manner to cause transfer of the new word into the blank location. Control circuit 16 is operative to synchronize the various operations.

A new word is stored by a pattern of pulses on input conductor 21. Conductor 21 couples the major loop in a manner to generate a bubble when pulsed. The presence or the absence of a pulse or conductor 21 during each of N cycles of the rotating field results in a pattern of N bits in N consecutive positions of the major loop for movement to the positions of close proximity. The requisite input pulses are supplied by an input source represented by block 22. The input source also is connected to the control circuit.

The foregoing operation of a bubble memory occurs with magnetic bubbles which are permitted to vary in size only within certain limits. Otherwise, anomalous behavior occurs introducing unwanted errors in the bit stream. The nominal bubble operating diameter for a layer 11 of a given material is determined by the value of a bias field antiparallel to the magnetization of a bubble. That bias field is provided by a permanent bias magnet structure which normally encompasses the bubble memory and is itself encompassed by a magnetically soft (permalloy) enclosure to ward off stray magnetic fields. The use of permanent magnet structures for providing the requisite bias field is well known. The bias magnet structure (assembly) is represented by block 25.

Figure 2:
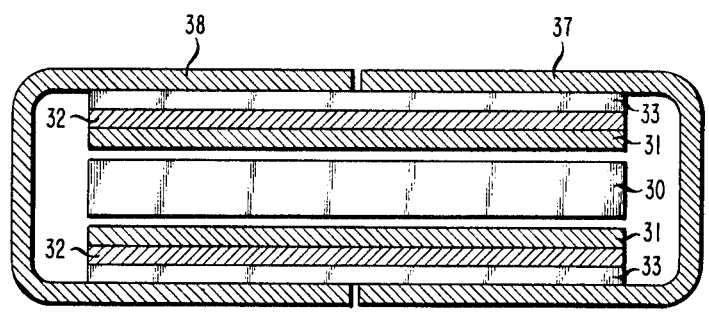
FIG. 2 is a cross section of a bias field structure and assembly in accordance with this invention for use with memories of the type shown in FIG. 1.

FIG. 2 shows a cross section of a bias magnet assembly in accordance with the present invention and suitable for use with a magnetic bubble memory as described in connection with FIG. 1. The memory itself comprising a printed circuit board, four magnetic memory chips mounted on the board and drive coils for supplying the rotating magnetic field occupies the space identified by block 30 in FIG. 2. Familiar plates 31 of high permeability (over from 140 to −50 degrees C.) ferrite such as high Curie temperature MnZn ferrite are placed to either side of block 30. The term "high Curie temperature" refers to materials which have Curie temperature above about 140 degrees C. Plates 32 of barium ferrite are placed next to plates 31. Blocks 33 represent stacked plates of rare earth garnets and/or Ni-Cu alloys placed next to plates 32. The entire structure is secured by slide-fit, C-shaped magnetically permeable clips 37 and 38.

The choices of materials for the bias magnet structure and for layer 11 of FIG. 1 determine the temperature range over which the bubble memory operates. A prior art bias magnet structure using only plates 31 and 32 exhibits a bias field versus temperature dependence that is linear with a slope of about −0.186 percent/degrees C. (normalized at 50 degrees C.). This slope matches the YSmCaGe bubble material over a temperature range of at most −20 to 80 degrees C. for practical applications.

But new wide temperature range materials have been developed (see above-noted copending patent application) for layer 11 which do not match prior art bias magnet structures. A most attractive wide temperature material, for example, is bismuth, rare earth (i.e., gadolinium, holmium) garnet which has a nonlinear temperature dependence characterized by a slope which has a magnitude typically less than that of barium ferrite at low temperatures and greater at higher temperatures. Composite plates 33 of FIG. 2 are utilized to increase or decrease the magnitude of the slope of the bias field from that of barium ferrite.

The materials used for plates 33 for increasing the temperature dependence of the bias field are characterized by a magnetization (magnetic moment) which decreases with increasing temperature. This is normal behavior for a ferromagnetic magnetic material. These materials are most useful for a range of temperatures just below their Curie temperatures. Materials useful for this application include low Curie temperature materials such as MnZn ferrites, Ni-Fe alloys and Cu-Ni alloys. Low Curie temperature MnZn ferrites were used to make a bias magnet structure with a −0.3 percent/degrees C. slope from about 0 degrees C. to 140 degrees C. But low Curie temperature materials are not yet available commercially for use below 0 degrees C. and they have a problem because they are brittle and difficult to use when ground to thin plates. Also, the Fe-Ni alloys are not available for low temperature use. The Cu-Ni alloys on the other hand can be formulated for use over a quite large range of temperatures and so were used to make a bias magnet structure for use over a temperature range of from −50 degrees C. to 140 degrees C.

Figure 3:
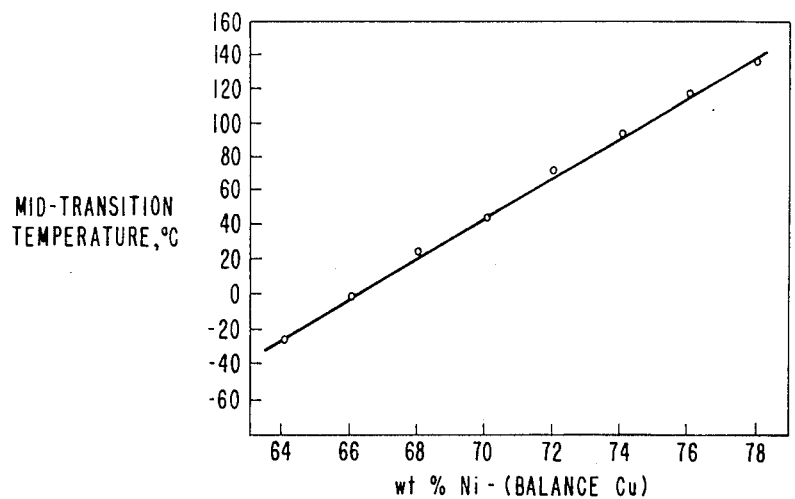
FIG. 3 is a plot of transition temperatures versus Ni-Cu compositions.
Figure 4:
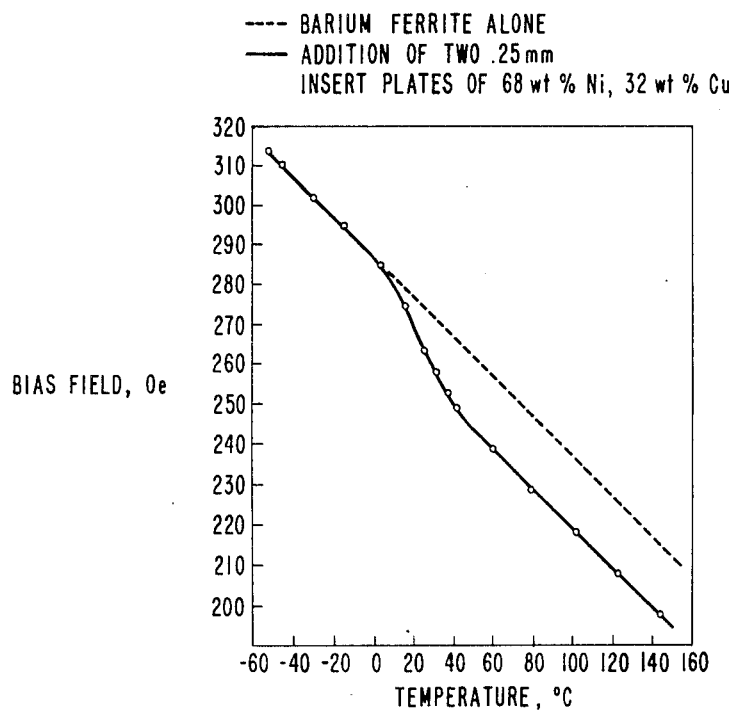
FIG. 4 is a plot of the effect of a two plates of 68 Ni-Cu on bias field.

FIG. 3 is a plot of transition temperatures (near the Curie temperature) versus composition for nickel-copper (Ni-Cu) alloys. Each alloy is active over a range of about 30 degrees C. FIG. 3 shows a plot of the midrange temperatures. FIG. 4 is a plot of bias field versus temperature for a structure of barium ferrite alone and with a total addition of 0.50 mm of 68 weight percent Ni, 32 weight percent of Cu. FIG. 4 illustrates the transition temperature in a structure such as shown in FIG. 2 where each of plates 33 comprised a single layer of an alloy containing 68 weight percent Ni balance Cu. The other alloys indicated in FIG. 3 are similar except that the transition temperature ranges are different. Several Ni-Cu plates with different compositions can be used together (overlapping or exclusive ranges) for each of plates 33 to produce a smooth increase in the temperature coefficient of the bias field.

Figure 5:
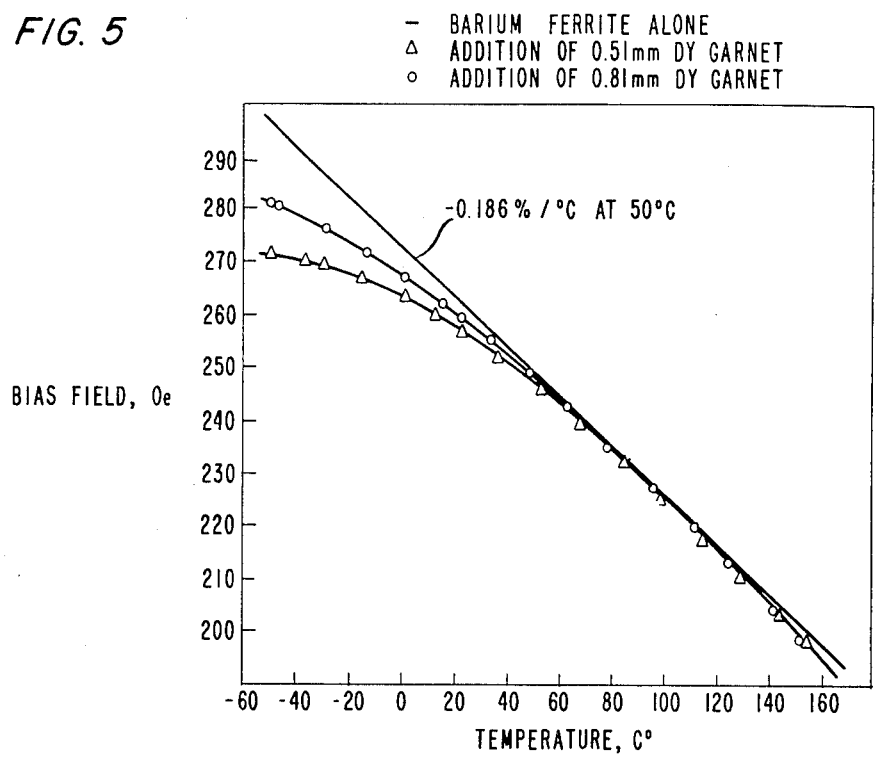
FIG. 5 is a plot of the effects of dysprosium iron garnet plates on bias field.

In another example, polycrystalline dysprosium iron garnet with a compensation point of about −50 degrees C. is employed. The effect of this material is illustrated in FIG. 5. FIG. 5 shows bias field versus temperature for three magnet structures; one with barium ferrite alone, a second with plates 33 of 0.51 mm dysprosium garnet, and a third with plates of 0.81 mm of dysprosium garnet. This plot shows that at low temperatures the bias slope magnitude has been decreased from that of barium ferrite alone. Single crystal dysprosium iron garnet can be used as well.

Figure 6:
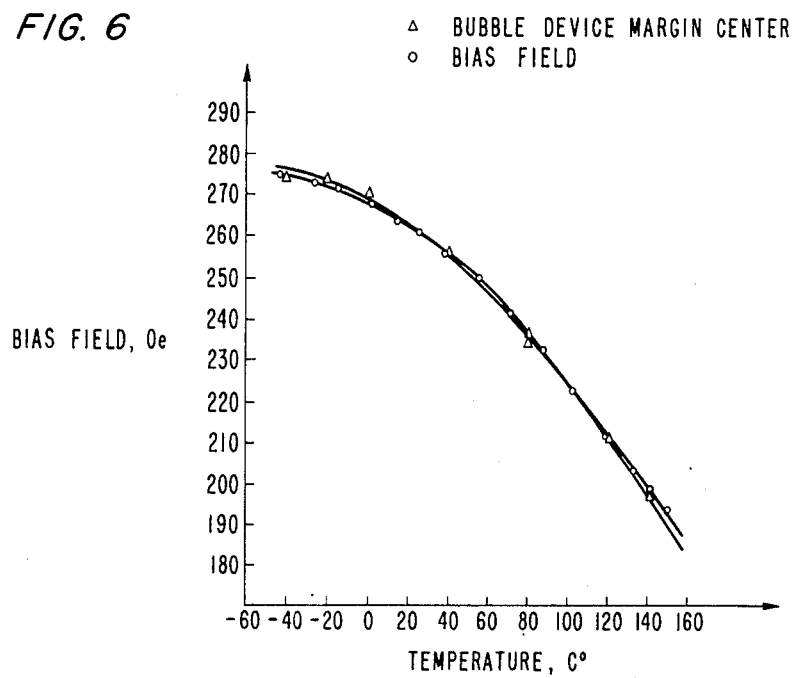
FIG. 6 is a plot of bias field versus temperature for a bubble device and for a matching magnet structure.

A combined structure composed of standard barium ferrite magnets, dysprosium garnet plates and several Ni-Cu alloy plates were employed to produce a bias field which closely matched the bias field temperature dependence of a package comprising four 68 Kbit 8 $\mu$m period wide gap permalloy chips made with (YBiGdHoCa)$_3$(FeSiGe)$_5$O$_{12}$. The temperature dependence of the optimum bias field was calculated using the known temperature dependence of the barium ferrite and bias field offsets determined from the package test. FIG. 6 shows a plot of bias field versus temperature for a bubble device and for a matching magnet (bias field) structure. The optimum bias field data are indicated by triangles in FIG. 6. The magnet structure was assembled using the insert materials listed in Table 1. The temperature dependence of the field in this magnet structure is indicated by circles in FIG. 6. The two sets of data match within ±2 Oe over the temperature range −50 degrees C. to 140 degrees C.

TABLE 1

| Tracking Magnet Insert Plates | |
|---|---|
| Insert Material | Representative Thickness (mm) |
| Dy$_3$Fe$_5$C$_{12}$ | .81 |
| 78 wt % Ni—Cu | .076 |
| 76 wt % Ni—Cu | .076 |
| 74 wt % Ni—Cu | .152 |
| 72 wt % Ni—Cu | .076 |

It is clear that both polycrystalline dysprosium garnet and Ni-Cu alloys can be used in bias magnet structures for use with wide temperature range bismuth garnet bubble materials.

Table 2 shows representative bismuth materials, compositions and characteristics.

TABLE 2

| Material | Optimum Circuit Periodicity | Bias Field vs. Temp. Characteristics |
|---|---|---|
| (YBiGdHoCa)$_3$(FeGeSi)$_5$O$_{12}$ | 8–6$\mu$ | nonlinear |
| (YBiErDyCa)$_3$(FeSi)$_5$O$_{12}$ | 4$\mu$ | nonlinear |
| (YBiSmGdCa)$_3$(FeSi)$_5$O$_{12}$ | 4$\mu$ | nonlinear |
| (YBiCa)$_3$(FeSiGe)$_5$O$_{12}$ | 8–4$\mu$ | linear |

In one specific embodiment Y$_{1.5}$Bi$_{0.5}$Gd$_{0.1}$Ho$_{0.2}$Ca$_{0.7}$Fe$_{4.3}$Ge$_{0.3}$Si$_{0.4}$O$_{12}$ was used as a nonlinear bubble material in accordance with this invention. In practice, nonlinear garnets are of interest for use as magnetic bubble materials. Such materials include terbium (Tb), dysprosium (Dy), holmium (Ho), erbium (Er), thulium (Tm), ytterbium (Yb) and lutetium (Lu).

Figure 7:
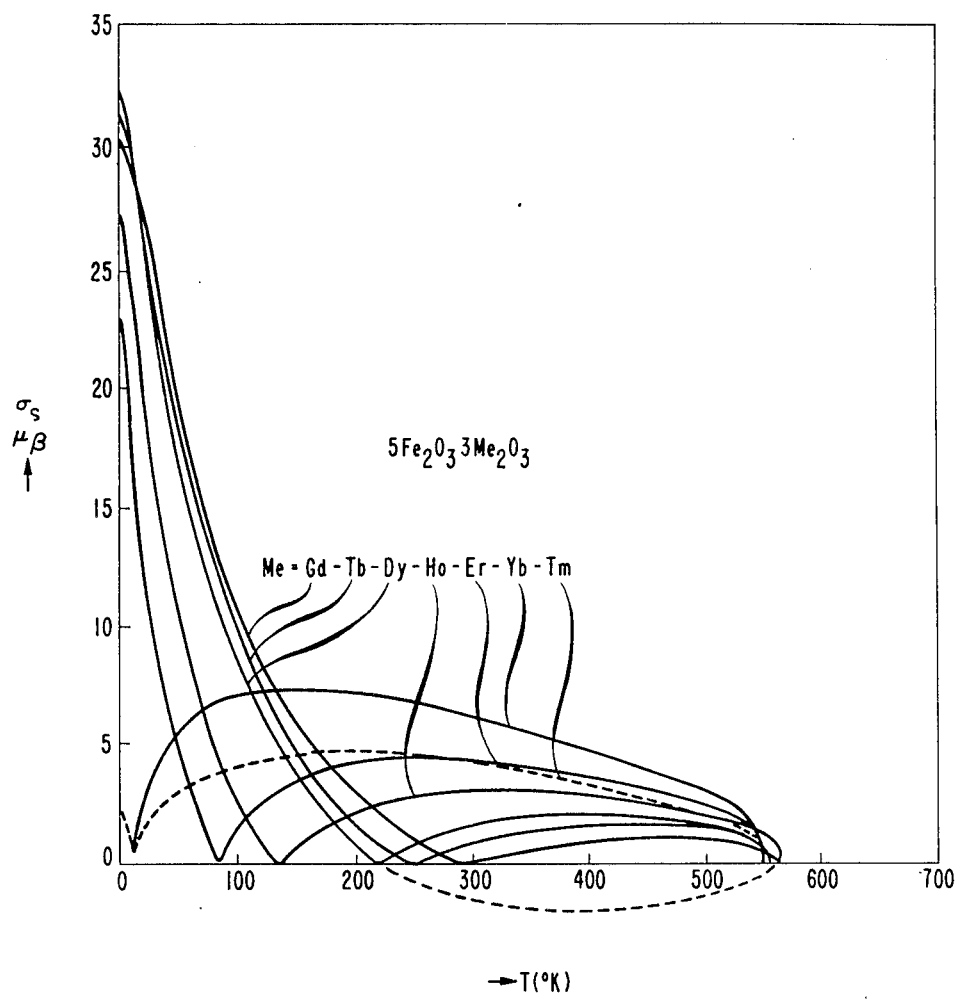
FIG. 7 is a plot of magnetic moment versus temperature for rare earth iron garnets.

FIG. 7 shows bias magnet materials used for plates 33 for compensating for such materials. In addition, spinels and intermetallic rare earth materials also show such a characteristic and are useful as nonlinear magnetic bias materials as taught herein. FIG. 7 is taken from Ferrites by Smit and Wijn, published by John Wiley and Sons, dated 1959, page 213. Nonlinear garnets require biasing magnets with both garnet plates for low temperature operation and Ni-Cu alloy plates for high temperature operation in order to provide a matching bias field over wide −50 to 140 degrees C. temperature range of interest.

It may be appropriate for additional garnet plates to be used in the magnet structure for fine adjusting of the match between the magnetization curve of the bubble layer and the bias field required.

What is claimed is:

1. A magnetic bubble memory comprising a layer of a first magnetic material in which magnetic bubbles can be moved in the presence of a magnetic bias field and a magnetic bias field structure for supplying said bias field, said magnetic material being of a composition to require a bias field which changes nonlinearly over a given temperature range for maintaining magnetic bubbles in said layer over said range, said bias field structure being a multilayer composite comprising a plate of barium ferrite, a plate of polycrystalline rare earth garnet, and a plate of Ni-Cu alloy, said composite having a magnetic moment that increases with increasing temperature above its compensation temperature.

2. A magnetic bubble memory in accordance with claim 1 including a plurality of plates of Ni-Cu alloys of differing compositions and a layer of a rare earth garnet.

3. A magnetic bubble memory in accordance with claim 1 comprising first and second multilayer composite plates sandwiching said layer of magnetic material therebetween.

4. A magnetic bias field structure including a multilayer composite comprising a plate of rare earth garnet, and a plate of Ni-Cu alloy, said composite having a magnetic moment that increases with increasing temperature above its compensation temperature to provide a bias field which changes nonlinearly over a prescribed temperature range.

* * * * *